US008330153B2

(12) United States Patent
Ooishi et al.

(10) Patent No.: US 8,330,153 B2
(45) Date of Patent: Dec. 11, 2012

(54) ORGANIC LIGHT-EMITTING DEVICE

(75) Inventors: Ryota Ooishi, Yokohama (JP); Jun Kamatani, Tokyo (JP); Kengo Kishino, Tokyo (JP); Tetsuya Kosuge, Yokohama (JP); Shigemoto Abe, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 200 days.

(21) Appl. No.: 13/009,065

(22) Filed: Jan. 19, 2011

(65) Prior Publication Data

US 2011/0175072 A1 Jul. 21, 2011

(30) Foreign Application Priority Data

Jan. 20, 2010 (JP) ................................ 2010-010011

(51) Int. Cl.
*H01L 51/52* (2006.01)
*H01L 51/54* (2006.01)

(52) U.S. Cl. ............ 257/40; 257/E51.018; 257/E51.049

(58) Field of Classification Search .................... 257/40, 257/E51.018, E51.049
See application file for complete search history.

(56) References Cited

U.S. PATENT DOCUMENTS 6,812,497 B2 11/2004 Kamatani et al.
6,838,818 B2 1/2005 Furugori et al.
7,108,924 B2 9/2006 Kamatani et al.
7,189,466 B2 3/2007 Moriyama et al.
7,388,100 B2 * 6/2008 Nishio .......................... 548/469
7,388,327 B2 6/2008 Kishino et al.
7,466,073 B2 12/2008 Kishino et al. ................ 313/504
7,608,677 B2 * 10/2009 Cella et al. .................... 528/196
7,687,154 B2 3/2010 Iwawaki et al.
7,691,292 B2 * 4/2010 Chichak et al. .......... 252/301.16
7,691,494 B2 * 4/2010 Chichak et al. ............... 428/690
7,695,640 B2 * 4/2010 Chichak et al. .......... 252/301.35
7,704,610 B2 * 4/2010 Chichak et al. ............... 428/690
7,718,087 B2 * 5/2010 Chichak et al. .......... 252/301.35
7,718,277 B2 * 5/2010 Chichak et al. ............... 428/690
7,914,907 B2 3/2011 Iwawaki et al.
8,089,064 B2 * 1/2012 Radu et al. ...................... 257/40
8,227,092 B2 * 7/2012 Park et al. ..................... 428/690
2006/0063030 A1 * 3/2006 Deaton et al. ................ 428/690
2007/0231600 A1 10/2007 Kamatani et al.
2007/0231601 A1 10/2007 Nakasu et al.
2007/0232803 A1 10/2007 Kamatani et al.
2008/0131730 A1 6/2008 Takiguchi et al.
2009/0039776 A1 2/2009 Yamada et al.
2010/0219407 A1 9/2010 Kamatani et al.
2011/0108810 A1 5/2011 Kishino

FOREIGN PATENT DOCUMENTS

JP 2003-068461 3/2003
JP 2006-128632 5/2006

OTHER PUBLICATIONS

M.A. Baldo et al. "Transient analysis of organic electrophosphorescence. II. Transient analysis of triplet-triplet annihilation", Physical Review B, vol. 62, No. 16, Oct. 15, 2000; p. 10967-10977.

* cited by examiner

*Primary Examiner* — Evan Pert
(74) *Attorney, Agent, or Firm* — Fitzpatrick, Cella, Harper & Scinto

(57) ABSTRACT

Provided is an organic light-emitting device that shows high luminous efficiency even when driven at a high luminance. More specifically, provided is an organic light-emitting device, including: an anode (transparent electrode layer) and a cathode (metal electrode layer); and an organic compound layer being interposed between the anode and the cathode, and including an emission layer, in which: the emission layer has a host, a first dopant, and a second dopant; the host includes an aromatic hydrocarbon compound; the first dopant includes a phosphorescent iridium complex; and the second dopant includes a compound having two triarylamine structures.

3 Claims, 2 Drawing Sheets

ORGANIC LIGHT-EMITTING DEVICE

BACKGROUND OF THE INVENTION

1. Field of the Invention

The present invention relates to an organic light-emitting device.

2. Description of the Related Art

Investigations have been vigorously conducted on organic light-emitting devices as flat light sources and as components for thin display panels at present. The organic light-emitting devices are each an electron device formed of: two electrodes; and a multilayer thin film formed of organic amorphous charge transport materials interposed between the two electrodes. In addition, the organic light-emitting devices are each such an electron device that charges (holes and electrons) are injected from the electrodes toward the thin film, the charges recombine in a specific compound to excite the specific compound, and light emitted in the deactivation process of the excited compound is extracted. Reports on the organic light-emitting devices available since olden times are, for example, light emission by the application of a voltage to an anthracene single crystal and light emission by a two-layer thin film of organic amorphous charge transport materials by Tang, et. al. In addition, in recent years, organic light-emitting devices and the like whose multilayer thin films are each formed of a double heterostructure (three-layer structure) formed of a hole transport layer, an emission layer, and an electron transport layer have also been proposed.

Meanwhile, fluorescent light-emitting materials each of which extracts a singlet exciton component out of the produced excitons as light emission and phosphorescent light-emitting materials each capable of extracting each of both a singlet exciton component and a triplet exciton component out of the produced excitons as light emission have been proposed as light-emitting materials in the organic light-emitting devices. By the way, excitons produced by charge recombination may be produced at a ratio "singlet exciton:triplet exciton" of 1:3 based on a spin selection rule. Here, each of the phosphorescent light-emitting materials can extract each of both a triplet exciton component and a singlet exciton component to be produced as light emission. Therefore, the phosphorescent light-emitting materials are extremely promising light-emitting materials in high-efficiency organic light-emitting devices because the materials each have an internal quantum efficiency of 100% in theory.

In view of the foregoing, the efficiency of each of organic light-emitting devices using the phosphorescent light-emitting materials can be improved as compared with that of each of the conventional organic light-emitting devices using the fluorescent light-emitting materials in theory. However, luminous efficiency sufficient for practical use has not been realized at present. For example, the external quantum yield of an organic light-emitting device formed of a combination of CBP that has been widely used as a host for a phosphorescent light-emitting material up to now and a phosphorescent light-emitting material $(Btp)_2Ir(acac)$ is around 7% at the maximum (Physical Review B, Volume 62, Number 16, p10967 (2000)). In other words, an improvement in efficiency, and a reduction in voltage, of each of the organic light-emitting devices using the phosphorescent light-emitting materials are insufficient at present, and hence an organic light-emitting device with its performance additionally improved from the viewpoints of efficiency and a voltage has been desired.

In addition, at present, each of the organic light-emitting devices using the phosphorescent light-emitting materials shows high luminous efficiency in a low-current state in which an emission luminance is low but undergoes a remarkable reduction in luminous efficiency in a high-current state in which the emission luminance is high. This is because, in the case of the phosphorescent light-emitting devices, the deactivation process of triplet excitons called triplet-triplet annihilation (T-T annihilation) is present in the high-current state (Physical Review B, Volume 62, Number 16, p10967 (2000)). The T-T annihilation occurs at a current density of about 1 $mA/cm^2$ in, for example, a platinum complex having a long phosphorescence lifetime. In addition, the T-T annihilation occurs at a current density of 10 $mA/cm^2$ to 100 $mA/cm^2$ in, for example, an iridium complex having a short phosphorescence lifetime. The T-T annihilation is a cause for the lowering of the emission luminance requested of each of the organic light-emitting devices as components for displays and the like, though the extent of the lowering varies depending on luminous efficiency.

Meanwhile, in the case of the organic light-emitting devices using the phosphorescent light-emitting materials, the lifetime of phosphorescence emitted from each of the light-emitting materials is long. As a result, a ratio of the amount of triplet excitons each of which is deactivated (emits light) to the amount of excitons produced per unit time increases, and hence the luminous efficiency of each of the devices reduces. This is because, in a high-current state, the density of the excitons in an emission layer increases, the triplet excitons are apt to collide with each other, and the probability that radiationless deactivation occurs increases. Accordingly, each of the organic light-emitting devices utilizing phosphorescence has involved the following problem. Each of the devices has high luminous efficiency in a low-luminance region but cannot utilize the high luminous efficiency in a high-luminance region, and as a result, its power consumption increases.

Meanwhile, Japanese Patent Application Laid-Open No. 2003-68461 discloses a technology involving incorporating a host, a phosphorescent light-emitting material, and a current promoter into an emission layer to enable low-voltage driving while injecting an additionally large amount of carriers into the emission layer at a low voltage. Here, in Japanese Patent Application Laid-Open No. 2003-68461, the constituents of the emission layer are selected so as to compensate the charge transport properties of the host and the current promoter, respectively. For example, the document discloses the following combination. When the host is electron transportable, the current promoter is hole transportable.

On the other hand, Japanese Patent Application Laid-Open No. 2006-128632 discloses, as a method of improving luminous efficiency, a technology involving using a fluorene multimer as a host and adding a second dopant for causing the intersystem crossing of excitons as well as a phosphorescent light-emitting dopant to an emission layer. The technology enables each of both a singlet exciton and a triplet exciton produced on the host to efficiently transfer its own excitation energy to the light-emitting dopant, and hence a considerable improvement in efficiency has been realized as compared with a conventional one.

Meanwhile, a technology by which high-quality display can be realized with an additionally low power consumption has been requested in association with the progress of a display technology in recent years. For example, a method involving representing an image to be displayed while partially increasing its luminance when the variations of light and shade exist in the image and a method involving providing a high-luminance display mode to correspond to outdoor display are available. On the other hand, time-division driving, passive driving, and the like have also been proposed as methods of driving devices, and light-emitting properties at high luminances have become more important than ever before.

Here, the method of Japanese Patent Application Laid-Open No. 2003-68461 described above may result in the formation of a charge transfer complex or exciplex when an electron transportable compound having electron-accepting property and a hole transportable compound having electron-donating property strongly interact with each other because both the compounds are mixed in the same layer. In addition, excitons produced by the recombination of holes and electrons disappear owing to the formation of the charge transfer complex or exciplex, and as a result, luminous efficiency may reduce. In addition, an additional investigation on the case where a high current is flowed is needed because a carrier balance may be lost and the luminous efficiency may reduce in the case.

In addition, the method of Japanese Patent Application Laid-Open No. 2006-128632 has been unable to crack a challenge of suppressing a reduction in luminous efficiency in a high-current region, and hence an additional investigation is needed again. In addition, when a phosphorescent light-emitting dopant whose luminescent color is green or blue is used, the number of kinds of materials capable of being responsible for intersystem crossing each of which is to be used as the second dopant is small, and hence it has been difficult to optimize a combination of the dopants.

SUMMARY OF THE INVENTION

An object of the present invention is to provide an organic light-emitting device that shows high luminous efficiency even when driven at a high luminance.

The present invention provides an organic light-emitting device, including an anode, a cathode, and an organic compound layer being interposed between the anode and the cathode, and including an emission layer, in which the emission layer has a host, a first dopant, and a second dopant, the host includes an aromatic hydrocarbon compound, the first dopant includes a phosphorescent iridium complex, and the second dopant includes a compound having two triarylamine structures.

According to the present invention, it is possible to provide an organic light-emitting device that shows high luminous efficiency even when driven at a high luminance.

Further features of the present invention will become apparent from the following description of exemplary embodiments with reference to the attached drawings.

DESCRIPTION OF THE EMBODIMENTS

An organic light-emitting device of the present invention is formed of: an anode; a cathode; and an organic compound layer being interposed between the anode and the cathode, and including at least an emission layer.

Hereinafter, the organic light-emitting device of the present invention is described with reference to the drawings. First, reference symbols in FIGS. 1A to 1D are described. Organic light-emitting devices are represented by 1, 2, 3, and 4, a substrate is represented by 10, transparent electrode layers are represented by 11 and 11*a*, a hole transport layer is represented by 12, an emission layer is represented by 13, an electron transport layer is represented by 14, a metal electrode layer is represented by 15, a hole- and/or exciton-blocking layer is represented by 16, an electron- and/or exciton-blocking layer is represented by 17, a reflective layer is represented by 18, and an electron injection layer is represented by 19. FIGS. 1A to 1D are schematic sectional views each illustrating an example of an embodiment in the organic light-emitting device of the present invention, and FIGS. 1A to 1D illustrate first to fourth embodiments, respectively.

Figure 1A:
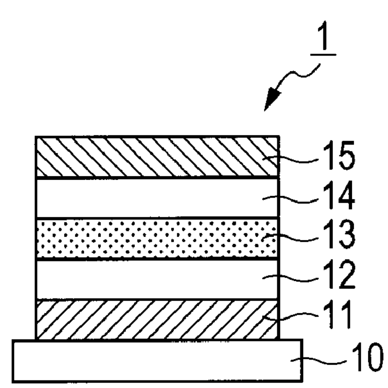
FIGS. 1A, 1B, 1C, and 1D are schematic sectional views each illustrating an example of an embodiment in an organic light-emitting device of the present invention.
Figure 1B:
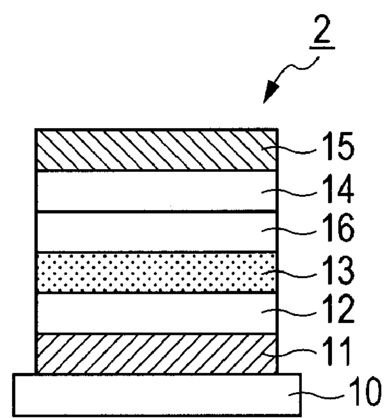
Figure 1C:
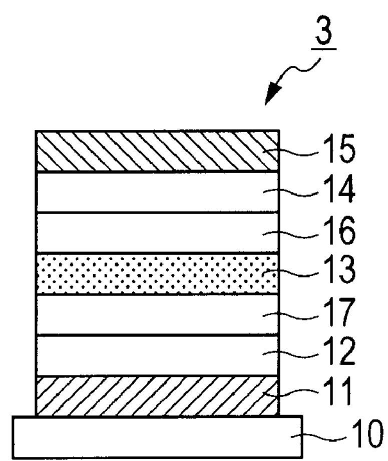
Figure 1D:
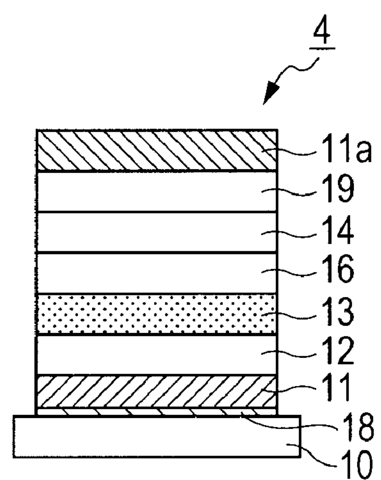

The organic light-emitting device 1 of FIG. 1A is such that the transparent electrode 11 (anode), the hole transport layer 12, the emission layer 13, the electron transport layer 14, and the metal electrode layer 15 (cathode) are laminated in the stated order on the substrate 10. The organic light-emitting device 2 of FIG. 1B is different from the organic light-emitting device 1 of FIG. 1A in that the hole- and/or exciton-blocking layer 16 is provided between the emission layer 13 and the electron transport layer 14. The organic light-emitting device 3 of FIG. 1C is different from the organic light-emitting device 2 of FIG. 1B in that the electron- and/or exciton-blocking layer 17 is provided between the hole transport layer 12 and the emission layer 13. The organic light-emitting device 4 of FIG. 1D is such that the reflective layer 18, the transparent electrode 11 (anode), the hole transport layer 12, the emission layer 13, the hole- and/or exciton-blocking layer 16, the electron transport layer 14, the electron injection layer 19, and the transparent electrode 11*a* (cathode) are laminated in the stated order on the substrate 10.

In the present invention, the configuration of the organic light-emitting device is, for example, any one of the configurations shown in the following items (i) to (vii) as well as the configurations illustrated in FIGS. 1A to 1D.

(i) (Substrate/)anode/emission layer/cathode (ii) (Substrate/)anode/hole transport layer/emission layer/cathode (iii) (Substrate/)anode/emission layer/electron transport layer/cathode (iv) (Substrate/)anode/hole transport layer/emission layer/electron transport layer/cathode (FIG. 1A)

(v) (Substrate/)anode/hole transport layer/electron- and/or exciton-blocking layer/emission layer/electron transport layer/cathode (vi) (Substrate/)anode/hole transport layer/emission layer/hole- and/or exciton-blocking layer/electron transport layer/cathode (FIG. 1B)

(vii) (Substrate/)anode/hole transport layer/electron- and/or exciton-blocking layer/emission layer/hole- and/or exciton-blocking/electron transport layer/cathode (FIG. 1C)

(viii) (Substrate/)anode/hole transport layer/emission layer/hole- and/or exciton-blocking layer/electron transport layer/electron injection layer/cathode (FIG. 1D)

It should be noted that the above-mentioned items (i) to (vii) are merely specific examples of an extremely basic device configuration and the organic light-emitting device of the present invention is not limited thereto. For example, a charge injection layer may be provided between an electrode and a charge transport layer, or an adhesion layer for improving adhesiveness between films may be provided. Alternatively, an interference layer for efficiently extracting light emission in the emission layer may be provided.

The emission layer in the organic light-emitting device of the present invention has a host and two kinds of dopants (a first dopant and a second dopant).

The process by which an organic light-emitting device having an emission layer formed of a carrier transportable host and a dopant (guest) emits light is formed of a combination of several processes shown below:

(1) the transport of electrons and holes on the host;
(2) the transport of electrons and holes on the dopant;
(3) the production of excitons on the host;
(4) the production of excitons on the dopant;
(5) energy transfer between host molecules; and
(6) energy transfer from the host molecules to dopant molecules.

Here, when a phosphorescent material is used as the dopant, a singlet exciton and a triplet exciton are excitons involved in light emission. In addition, the above-mentioned processes (1) to (6) occur in competition among various deactivation processes. Meanwhile, an improvement in luminous efficiency of the organic light-emitting device requires efficient production of excitons as a result of balanced injection of a large amount of both carriers, i.e., holes and electrons from electrodes into the emission layer.

Next, the constituents of the emission layer are described.

The host in the emission layer is an aromatic hydrocarbon compound, and more specifically, a compound having a main skeleton in which aromatic rings or fused rings such as fluorene, phenanthrene, naphthalene, and benzene are linearly or radially coupled. It should be noted that any such aromatic ring or fused ring as described above may be further bonded to the main skeleton. Alternatively, an alkyl group such as a methyl group may be further bonded to the main skeleton, or an aromatic ring or fused ring bonded to the main skeleton.

Such compound has bipolar property as charge transport property. In addition, the highest occupied molecular orbitals (HOMOs) and lowest unoccupied molecular orbitals (LUMOs) of the molecules of such compound are placed at the same positions in the molecules. Accordingly, the above-mentioned aromatic hydrocarbon compound functions as a hopping site upon transfer of charges (holes and electrons). In addition, distances between the orbitals are substantially equal to each other and charge mobilities easily become uniform, and hence the compound is preferred.

In addition, polarization occurs in each molecule of the above-mentioned aromatic hydrocarbon compound to a small extent. As a result, the compound receives a small stress from an external electric field when driven as an organic light-emitting device. Accordingly, the compound can stabilize the state of a thin film containing the compound. Further, the above-mentioned aromatic hydrocarbon compound has a small interaction with any other compound mixed into the emission layer, and hence can prevent, for example, the formation of an exciplex. Meanwhile, a current can be efficiently flowed in the above-mentioned aromatic hydrocarbon compound even at a low voltage because the compound forms an internal electric field to a small extent and seldom offsets an external electric field.

Specific examples of the host in the emission layer are shown below, provided that the compounds shown below are merely specific examples and the present invention is not limited thereto.

A-1

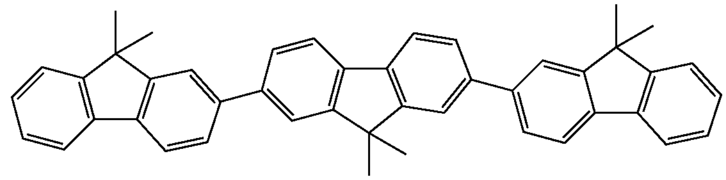

A-2

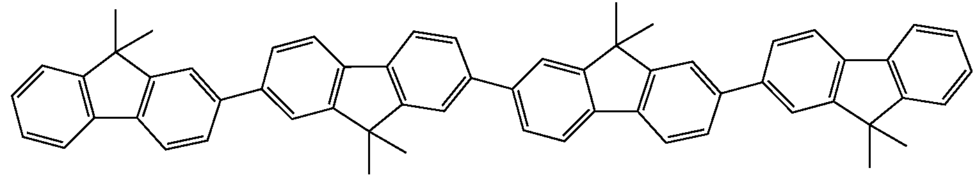

A-3

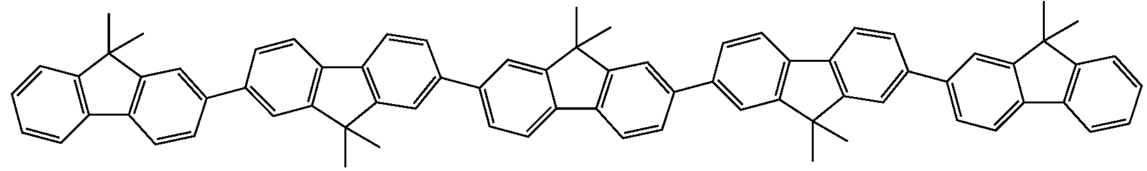

A-4

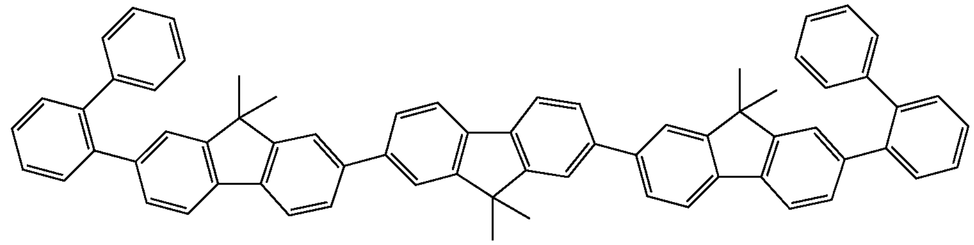

-continued
A-5
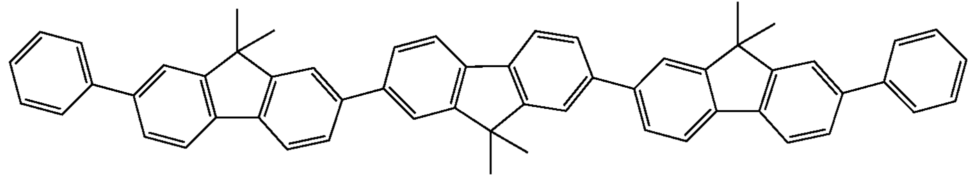
A-6
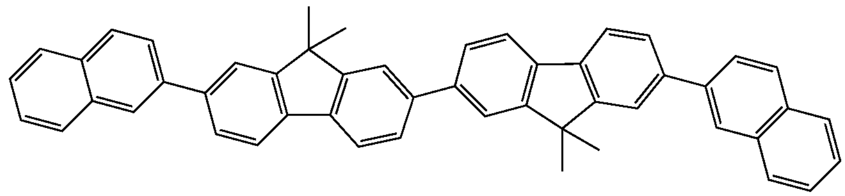
A-7
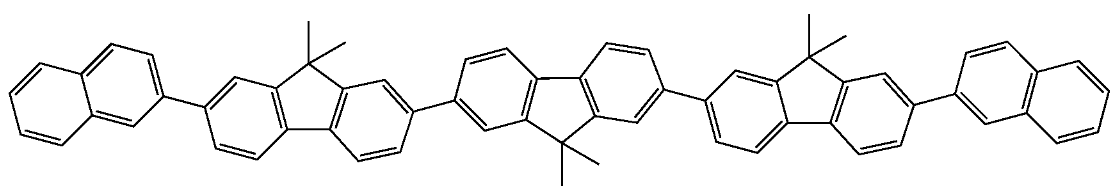
A-8
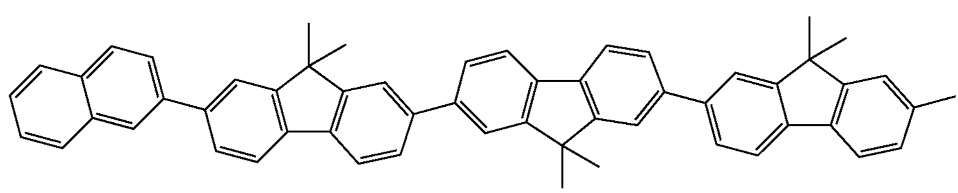
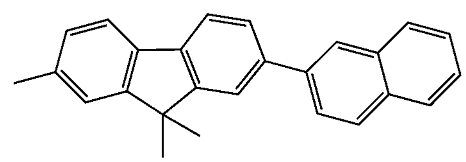
A-9
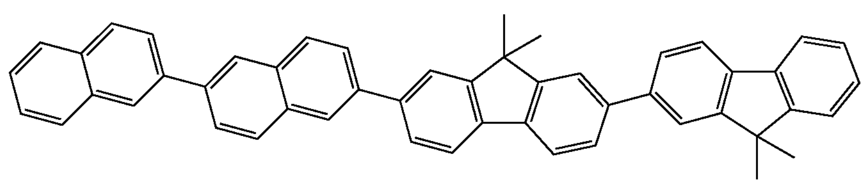
A-10
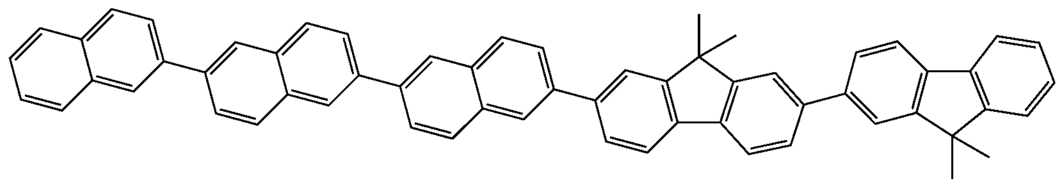
A-11
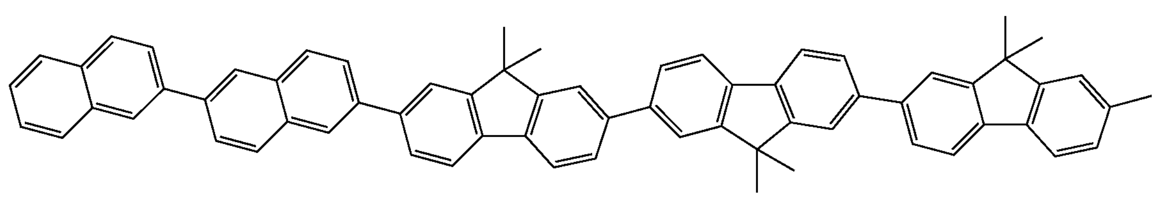

-continued
A-12
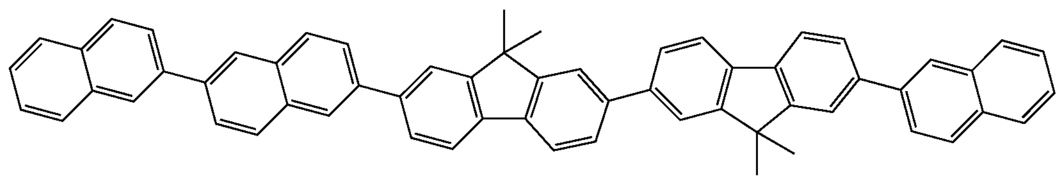
A-13
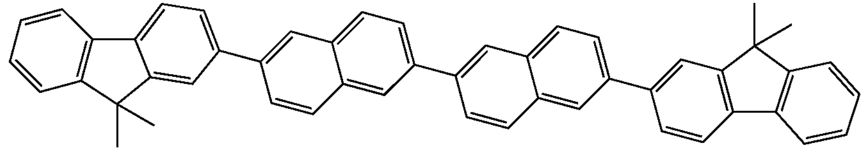
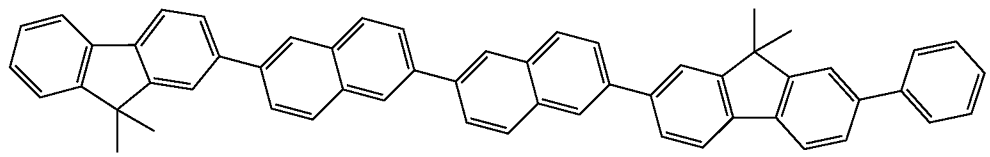
A-14
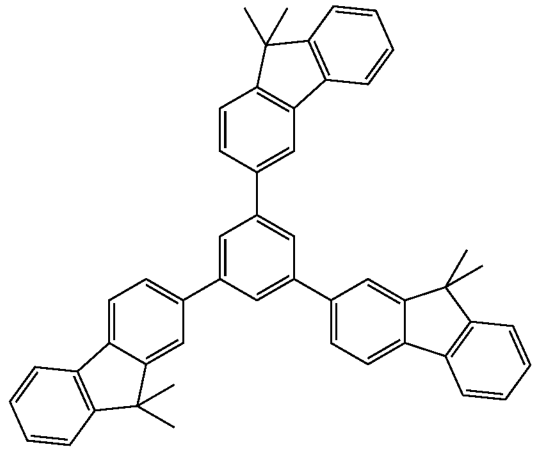
A-15
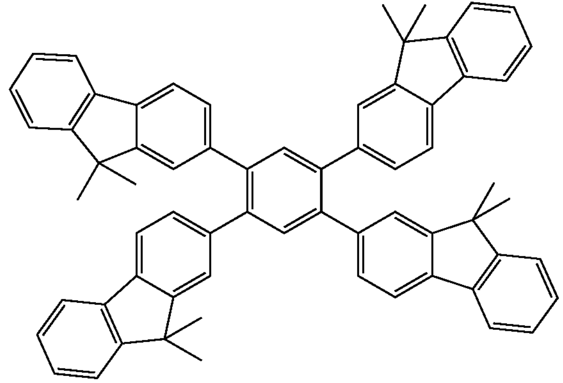
A-16
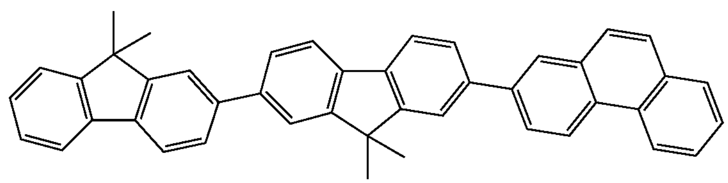

-continued

A-17

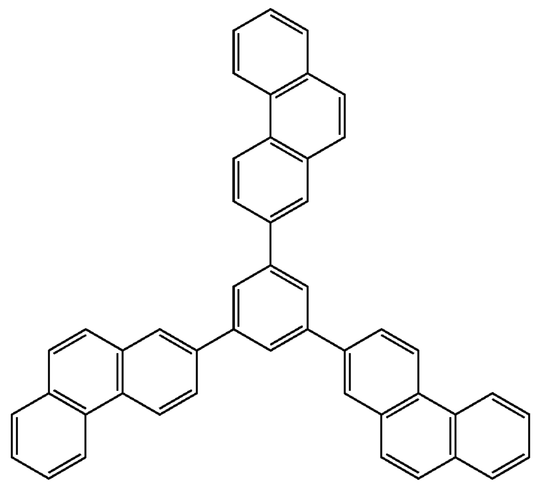

A-18

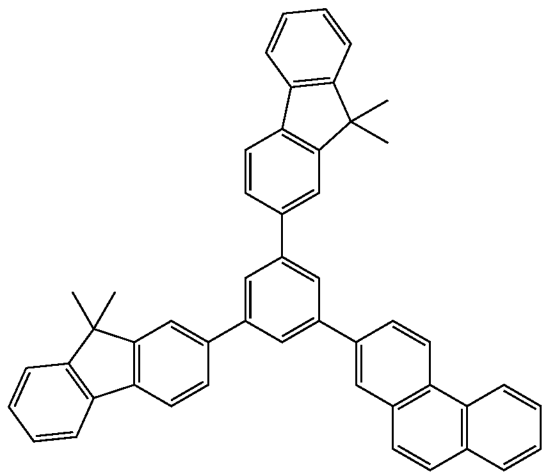

A-19

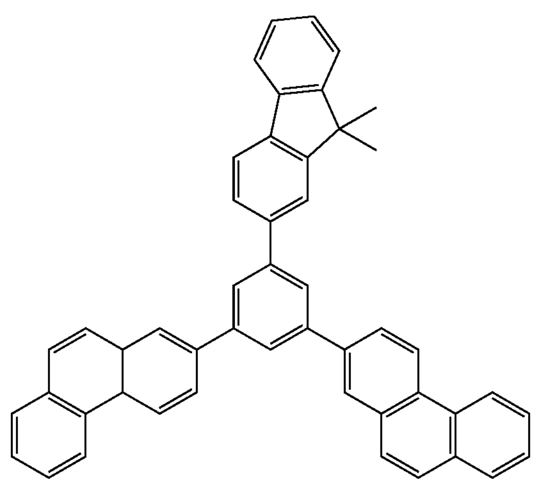

A-20

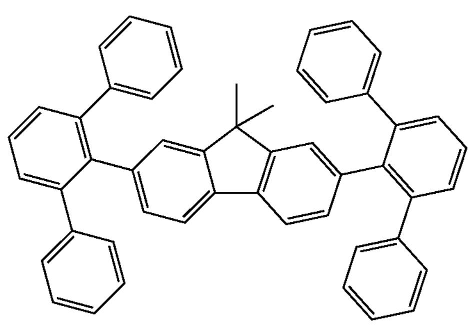

The first dopant in the emission layer is a phosphorescent iridium complex. Here, it is important that the first dopant be a material having a short phosphorescence lifetime for the realization of an improvement in efficiency of phosphorescence. This is because of the following reason. When the phosphorescence lifetime is long, the number of triplet excitons produced by charge injection becomes larger than the number of excitons to be deactivated, and hence T-T annihilation is apt to occur even at a low current density. Accordingly, the first dopant is desirably an iridium complex having a short phosphorescence lifetime. Here, the content of the first dopant in the emission layer is desirably about 1 wt % to 5 wt % from the viewpoint of light-emitting property. When the layer contains the iridium complex at a larger content than the foregoing, quenching (concentration quenching) between the molecules of the light-emitting dopant is apt to occur, and hence the luminous efficiency reduces.

The first dopant is preferably a compound represented by any one of the following general formulae (1) to (6).

(1)

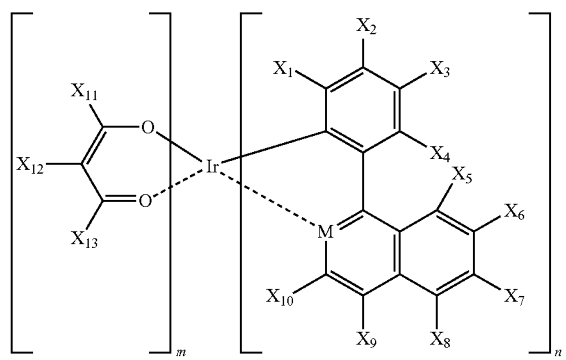

-continued (2)

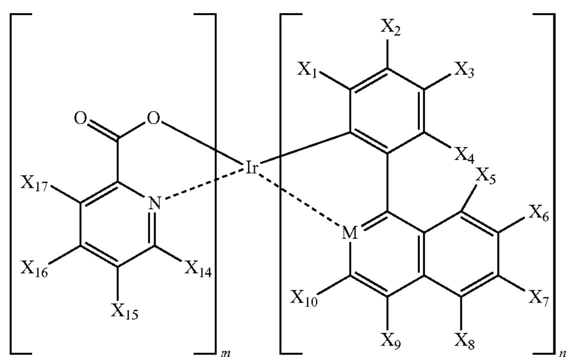

(3)

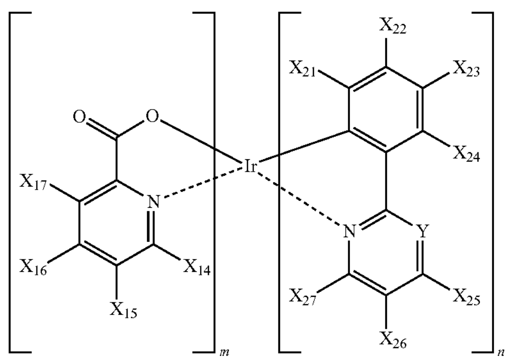

(4)

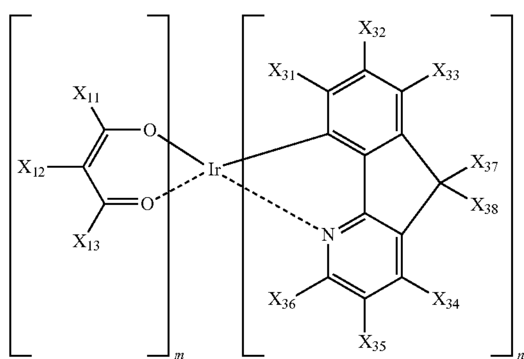

(5)

-continued (6)

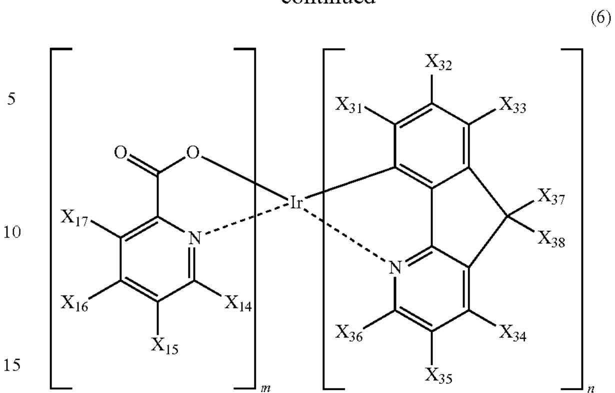

(In the formulae (1) and (2), $X_1$ to $X_{10}$ each represent one of a hydrogen atom, an unsubstituted or fluorine atom-substituted alkyl group, an aryl group, an alkoxy group, and a halogen atom, and m represents an integer of 0 to 2 and n represents an integer of 1 to 3, provided that m+n=3.

In the formula (1), $X_{11}$ to $X_{13}$ each represent one of a hydrogen atom, an unsubstituted or fluorine atom-substituted alkyl group, an aryl group, an alkoxy group, and a halogen atom.

In the formula (2), $X_{14}$ to $X_{17}$ each represent one of a hydrogen atom, an unsubstituted or fluorine atom-substituted alkyl group, an aryl group, an alkoxy group, and a halogen atom.

In the formulae (3) and (4), $X_{21}$ to $X_{27}$ each represent one of a hydrogen atom, an unsubstituted or fluorine atom-substituted alkyl group, an aryl group, an alkoxy group, and a halogen atom, Y represents one of N and CR (R represent the same substituent as that represented by each of $X_{21}$ to $X_{27}$), and m represents an integer of 0 to 2 and n represents an integer of 1 to 3, provided that m+n=3.

In the formula (3), $X_{11}$ to $X_{13}$ each represent one of a hydrogen atom, an unsubstituted or fluorine atom-substituted alkyl group, an aryl group, an alkoxy group, and a halogen atom.

In the formula (4), $X_{14}$ to $X_{17}$ each represent one of a hydrogen atom, an unsubstituted or fluorine atom-substituted alkyl group, an aryl group, an alkoxy group, and a halogen atom.

In the formulae (5) and (6), $X_{31}$ to $X_{38}$ each represent one of a hydrogen atom, an unsubstituted or fluorine atom-substituted alkyl group, an aryl group, an alkoxy group, and a halogen atom, and m represents an integer of 0 to 2 and n represents an integer of 1 to 3, provided that m+n=3.

In the formula (5), $X_{11}$ to $X_{13}$ each represent one of a hydrogen atom, an unsubstituted or fluorine atom-substituted alkyl group, an aryl group, an alkoxy group, and a halogen atom.

In the formula (6), $X_{14}$ to $X_{17}$ each represent one of a hydrogen atom, an unsubstituted or fluorine atom-substituted alkyl group, an aryl group, an alkoxy group, and a halogen atom.

Substituents of the compounds represented by the general formulae (1) to (6) are described below.

Examples of the unsubstituted or fluorine atom-substituted alkyl group represented by each of $X_1$ to $X_{10}$ include a methyl group, an ethyl group, and a trifluoromethyl group.

Examples of the aryl group represented by each of $X_1$ to $X_{10}$ include a phenyl group.

Examples of the alkoxy group represented by each of $X_1$ to $X_{10}$ include a methoxy group.

Examples of the halogen atom represented by each of $X_1$ to $X_{10}$ include fluorine.

Specific examples of the unsubstituted alkyl group or alkyl group with a substituted fluorine atom, the aryl group, the alkoxy group, and the halogen atom represented by each of $X_{11}$ to $X_{27}$, $X_{21}$ to $X_{27}$, and $X_{31}$ to $X_{38}$, and R are the same as those for $X_1$ to $X_{10}$.

Specific examples of the first dopant in the emission layer are shown below, provided that, the compounds shown below are merely specific examples and the present invention is not limited thereto.

B-1

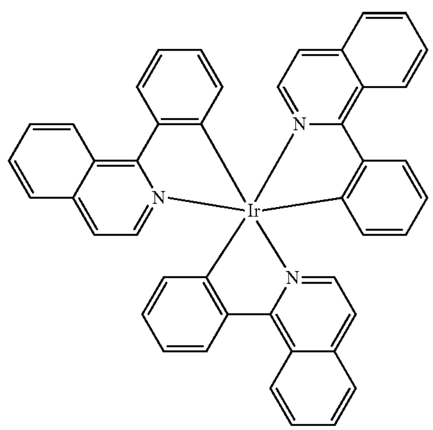

B-2

B-3

-continued

B-4

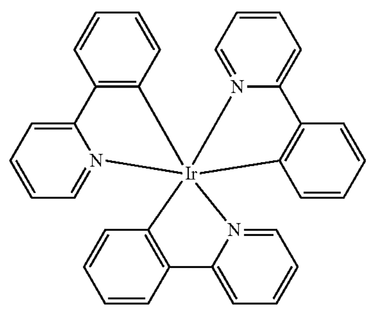

B-5

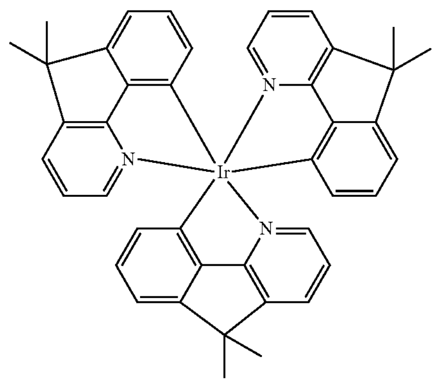

B-6

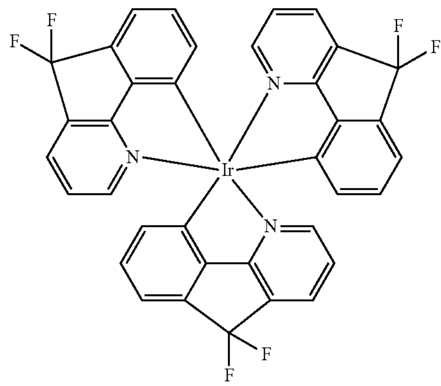

B-7

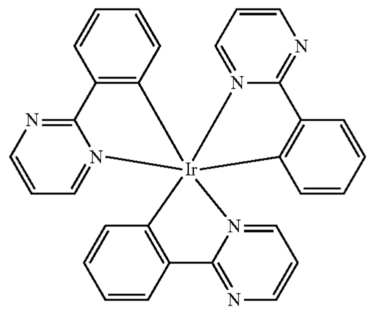

-continued

B-8

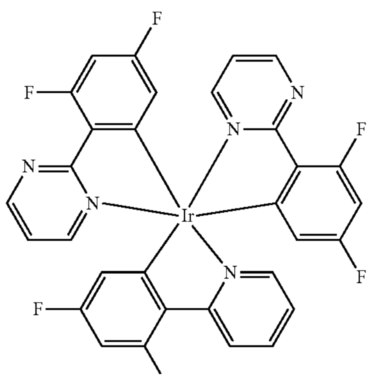

B-9

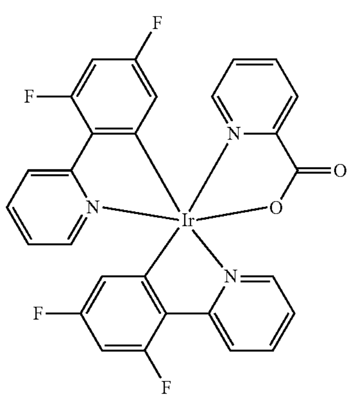

B-10

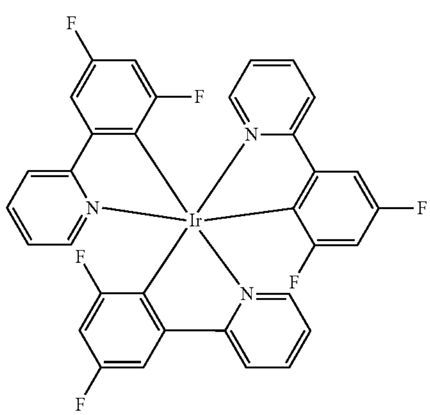

B-11

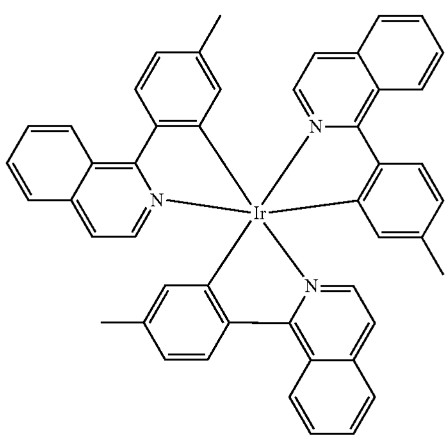

The second dopant in the emission layer is a compound having two triarylamine structures. Compounds having triarylamine structures are each excellent in hole injection property because each of the compounds has strong electron-donating property and the absolute value of its highest occupied molecular orbital (HOMO) is small in general. In addition, when the number of triarylamine structure sites is two or more, any such compound adopts a twisted structure in any one of its molecules. Accordingly, there are multiple stable conformations which the molecules can adopt. As a result, crystallization is suppressed when the compound is used in a thin film, and the thin film is hence excellent in film property. However, a compound having three or more triarylamine structures is not preferred because a charge balance in the emission layer changes to a large extent and the luminous efficiency reduces irrespective of whether a current density is low or high.

Here, the content of the second dopant in the emission layer is desirably larger than the content of the first dopant and smaller than the content of the host. Specifically, the content is preferably about 5 wt % to 40 wt %.

The second dopant is preferably a compound represented by the following general formula (7).

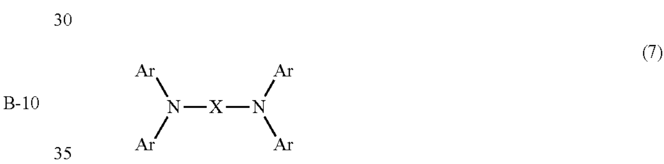

(7)

(In the formula (7), X represents a substituted or unsubstituted arylene group and Ar represents a substituted or unsubstituted aryl group.)

Substituents of the compound represented by the general formula (7) are described below.

Examples of the arylene group represented by X include phenylene, biphenylene, fluorenylene, and spirofluorenylene.

Examples of the substituents which may be further possessed by the above-mentioned arylene group include alkyl groups such as a methyl group, unsubstituted or fluorine atom-substituted alkyl groups such as a methyl group, an ethyl group, and a trifluoromethyl group, aryl groups such as a phenyl group, alkoxy groups such as a methoxy group, and a phenyl group which may be substituted with a halogen atom such as fluorine.

Examples of the aryl group represented by Ar include a phenyl group, a naphthyl group, and a fluorenyl group.

Examples of the substituents which may be further possessed by the above-mentioned aryl group include alkyl groups such as a methyl group, and substituted amino groups such as a diphenylamino group and a naphthylphenylamino group.

Specific examples of the second dopant in the emission layer are shown below, provided that, the compounds shown below are merely specific examples, and the present invention is not limited thereto.

-continued
C-1
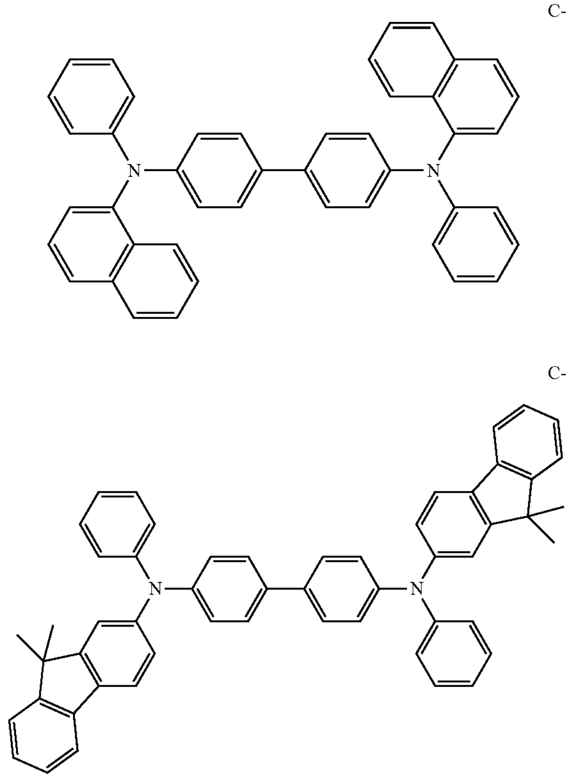
C-2
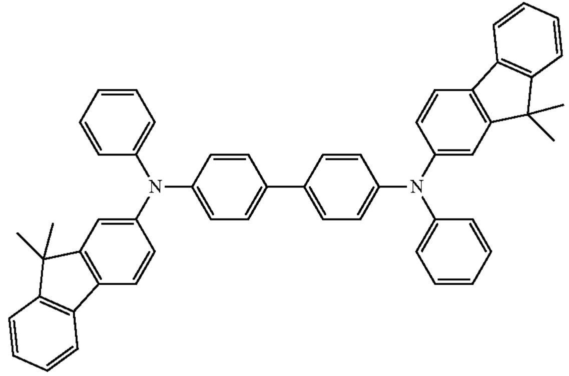
C-3
C-6
C-7
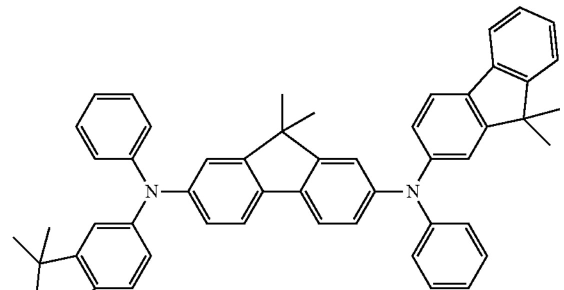
C-8
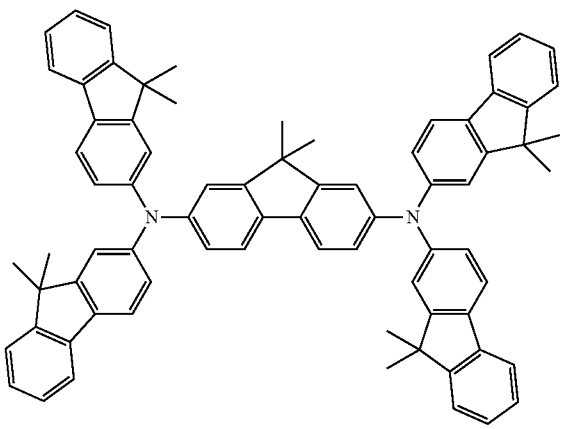
C-11
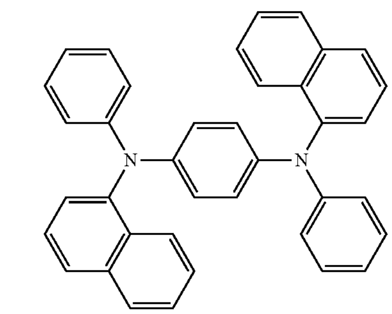
C-12
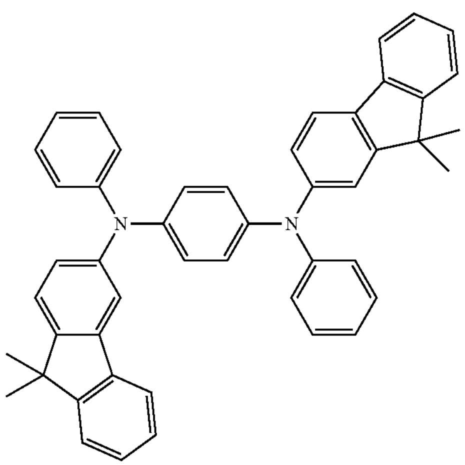

-continued

C-13

C-16

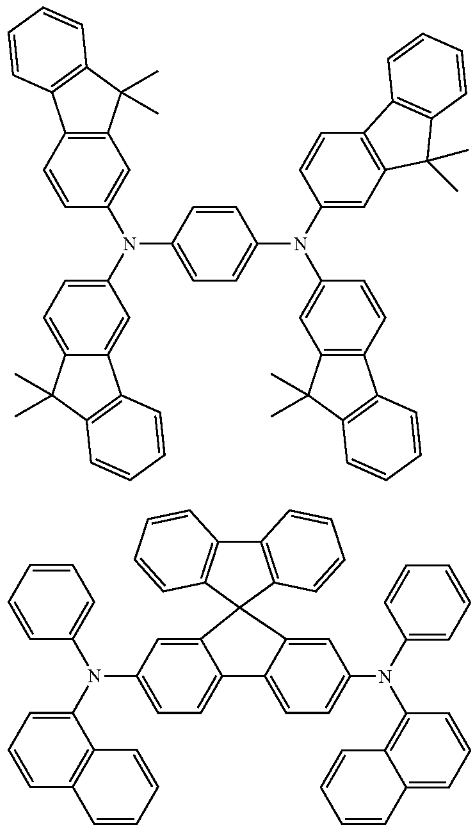

Next, reasons for incorporating the second dopant, in addition to the host and the first dopant, into the emission layer are described below.

Once the aromatic hydrocarbon compound as the host and the metal complex (iridium complex) as the first dopant mix with each other, the metal complex serves as a crystal nucleus to cause the crystallization and the film property deteriorates in some cases even when the concentration of the metal complex in the emission layer is as low as about 1 wt % to 5 wt %. The phenomenon, which is caused by a combination of the constituents of the layers around the emission layer, a method of treating the substrate, and a method for a treatment after the production of the device, hampers repeatability in the device production. On the other hand, when the concentration of the metal complex in the emission layer falls within the range of 6 wt % to 20 wt %, the film property of the thin film is improved, but such an inconvenience that the luminous efficiency reduces owing to an interaction between the molecules of the light-emitting dopant is apt to occur.

In addition, when the emission layer is doped with the iridium complex, hole transport performance resulting from the host's own good bipolar property remarkably reduces. This is probably caused by the fact that the HOMO of the iridium complex is deeper than the HOMO of the aromatic hydrocarbon compound. Accordingly, charge recombination positions are limited to a region in the emission layer corresponding to the hole transport layer, an exciton density increases in a high-current state, and the T-T annihilation is apt to occur.

Accordingly, the compound having two triarylamine structures is incorporated as the second dopant into the emission layer of the organic light-emitting device of the present invention. The incorporation can solve the conventional problem, i.e., a reduction in luminous efficiency of the device in a high-current state resulting from the T-T annihilation.

Here, the following phenomenon is assumed to be occurring as a result of the addition of the second dopant (compound having two triarylamine structures) to the emission layer together with the aromatic hydrocarbon compound as the host and the metal complex as the first dopant.

First, most of holes and electrons injected from the anode and the cathode into the emission layer through charge injection/transport layers may be taken in by the host (aromatic hydrocarbon compound) most abundant in the emission layer when the holes and the electrons enter the emission layer.

Meanwhile, part of the holes that have entered the emission layer are taken in by one of the two kinds of dopants (the first dopant (iridium complex) and the second dopant (compound having two triarylamine structures)), and the dopant that has taken in the holes exists in a positively charged state. On the other hand, the HOMO energy levels of the first dopant and the second dopant are close to each other, and hence charge exchange can be facilitated with energy close to thermal energy as activation energy. In addition, the incorporation of the second dopant at a certain content (specifically 10 wt % to 40 wt %) into the emission layer can cause charge exchange between the molecules of the second dopant because the second dopant is a compound having high hole transport property. Meanwhile, the electrons are taken in mainly by the host having the deepest LUMO. In addition, the ratio at which the first dopant and the second dopant take in the electrons is extremely low because the LUMOs of both the dopants are shallower than the LUMO of the host. Therefore, the probability that both charges encounter on the first dopant or the second dopant is extremely low, and hence most places where the charges recombine to produce excitons first may exist in the host.

The excitons produced on the host are formed of singlet excitons and triplet excitons at a ratio of 1:3 based on the spin states of the charges. Here, each of the singlet excitons produced on the host may transfer its own excitation energy to the first dopant or the second dopant. However, the first dopant absorbs singlet light emission from the host to a small extent because the first dopant is a phosphorescent material. Accordingly, the transfer of singlet energy from the host to the first dopant resulting from a Foerster mechanism as a main mechanism for transferring singlet excitons becomes extremely difficult. Meanwhile, the second dopant can receive the singlet excitation energy of the host serving as a singlet exciton because the second dopant absorbs the singlet light emission from the host. In addition, the singlet excitation energy that has transferred to the second dopant collides with the holes flowing through the second dopant so as to be deactivated or is consumed by thermal deactivation occurring on the second dopant. Therefore, most of the singlet excitons produced on the host disappear without reaching the first dopant. As a result, the singlet excitons accounting for 25% of all excitons present in the emission layer are not transformed into triplet excitons, and hence the T-T annihilation can be prevented. Meanwhile, the triplet excitation energy of each of the triplet excitons produced on the host transfers to the first dopant to cause phosphorescence derived from the first dopant.

Differences in the above-mentioned mechanism for light emission in the organic light-emitting device between a low-current state and a high-current state are as described below. The term "low-current state" as used herein refers to a state in which the amount of the dopants present in the emission layer is large for a charge quantity injected per unit time. The term "high-current state" as used herein refers to a state in which the amount of the dopants present in the emission layer is small for the charge quantity injected per unit time. The organic light-emitting device of the present invention may be brought into the high-current state when a current to be applied is about 10 $mA/cm^2$ or more.

Here, the manner in which the second dopant functions in each of both the low-current state and the high-current state is described below.

In the low-current state, molecules of the first dopant that are not charged exist in a sufficient amount because the charge quantity is small for the amount of the first dopant. Accordingly, the first dopant can receive the triplet excitation energy from the host. In this case, the second dopant can receive charge from part of the molecules of the first dopant that are charged, but molecules of the first dopant that are not charged exist in a sufficient amount, and hence whether the second dopant is present or absent may exert no large effects.

On the other hand, in the high-current state, most molecules of the first dopant present in the emission layer are brought into positively charged states because the charge quantity is large for the amount of the first dopant. Accordingly, the first dopant cannot directly receive the triplet excitation energy of each triplet exciton. Even if the first dopant can receive the energy, quenching may occur owing to an interaction between charge and the triplet exciton. Here, when the second dopant is caused to exist as a receiver for charge, the positive charge taken in by the first dopant can be easily transferred to the second dopant with energy close to thermal energy as activation energy. As a result, the ratio of the molecules of the first dopant that are charged can be reduced, and the reception of the triplet excitation energy can be efficiently performed.

As described above, the second dopant has the following characteristics (a) to (c):

(a) the second dopant efficiently deactivates the singlet excitation energy generated from the host with the charge which the second dopant has received from the first dopant to suppress the T-T annihilation;

(b) in the high-current state, the second dopant can receive the positive charge which the first dopant can take in to reduce the amount (density) of the molecules of the first dopant that are charged; and (c) the second dopant enables efficient transfer of the triplet excitation energy generated from the host to the first dopant.

Having such mechanism, the organic light-emitting device of the present invention can realize high-efficiency light emission without reducing its luminous efficiency even in the high-current state.

By the way, as described above, crystallization occurs when the concentration of the first dopant with respect to the host is low. The crystallization is alleviated by further mixing the second dopant. This is probably because the incorporation of the second dopant having high amorphous property has suppressed the production of fine crystals in the thin film. The suppression of the production of fine crystals can suppress a reduction in luminous efficiency due to the scattering of light in the thin film, and hence an improvement in efficiency can be realized.

Meanwhile, light emission based on an exciplex or charge transfer complex as well as light emission derived from the light-emitting dopant has been conventionally observed as a result of a strong interaction between the host compound and the second dopant, but no such light emission is observed in the organic light-emitting device of the present invention.

In the organic light-emitting device of the present invention, known charge injection/transport materials can be used as the constituents of charge injection/transport layers except the emission layer.

In the organic light-emitting device of the present invention, known electrode materials can be used as the constituents of the transparent electrode layers, the metal electrode layer, and the reflective layer.

A substrate to be used in the organic light-emitting device of the present invention is not particularly limited, but there is used an opaque substrate such as a metallic substrate or a ceramic substrate, or a transparent substrate such as glass, quartz, or a plastic sheet. In addition, a color filter film, a color conversion filter film, a dielectric reflective film, or the like can be used in the substrate to control colored light. In addition, a device can be produced by producing a thin film transistor on the substrate and by connecting the thin film transistor to the substrate. In addition, with regard to the direction in which light is extracted from the device, both a bottom emission type, in which light is extracted from a substrate side, and a top emission type, in which light is extracted from the side opposite to the substrate, are available.

Compounds shown below were used in examples to be described later.

H1

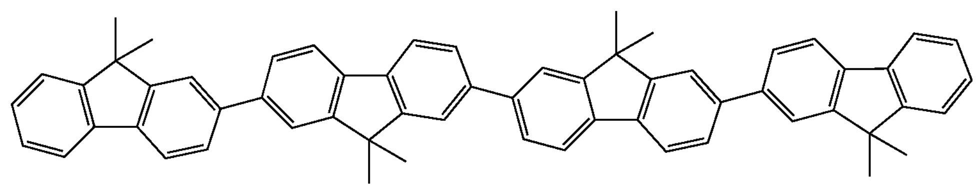

A1

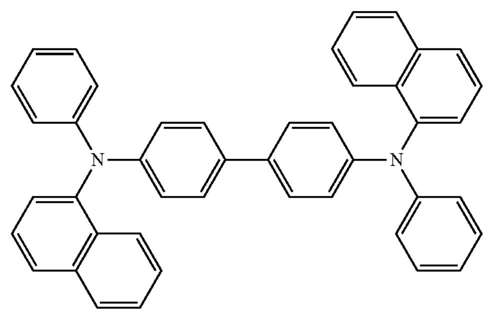

A4

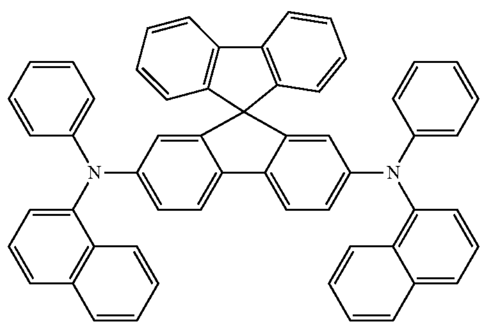

-continued
H2
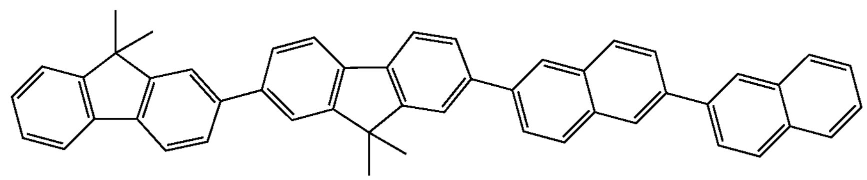
A2
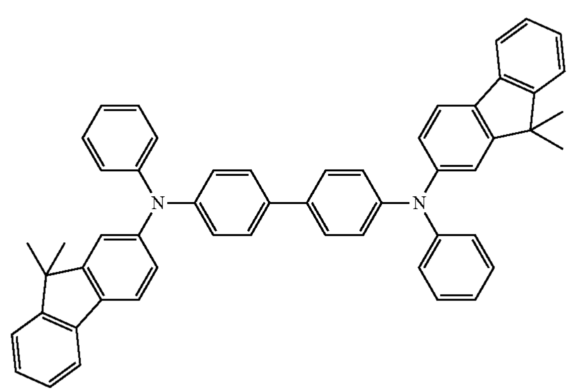
A5
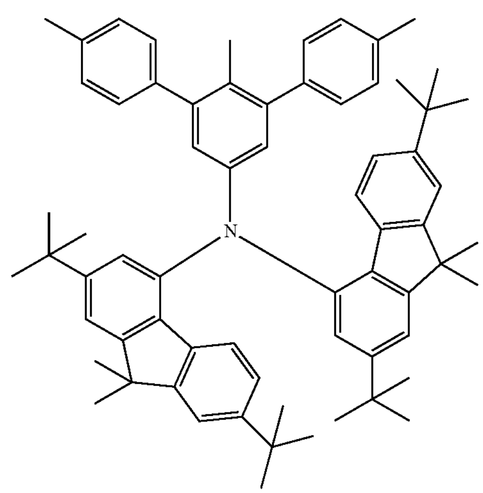
H3
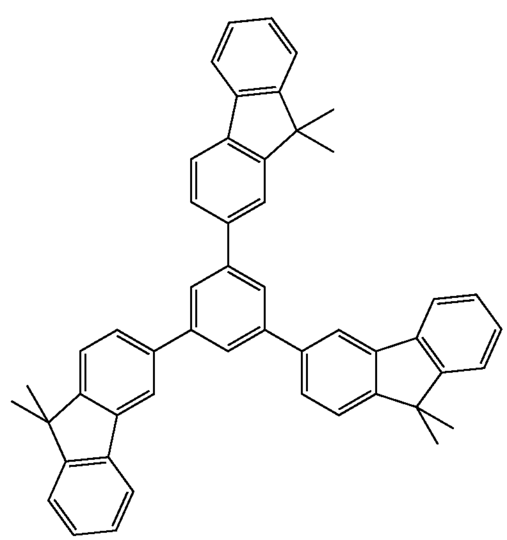
A3
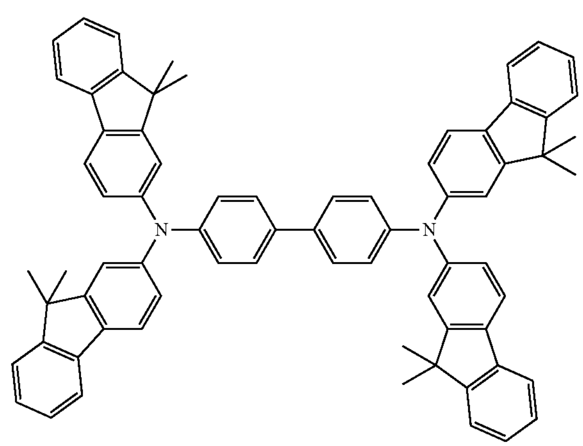

-continued
A6
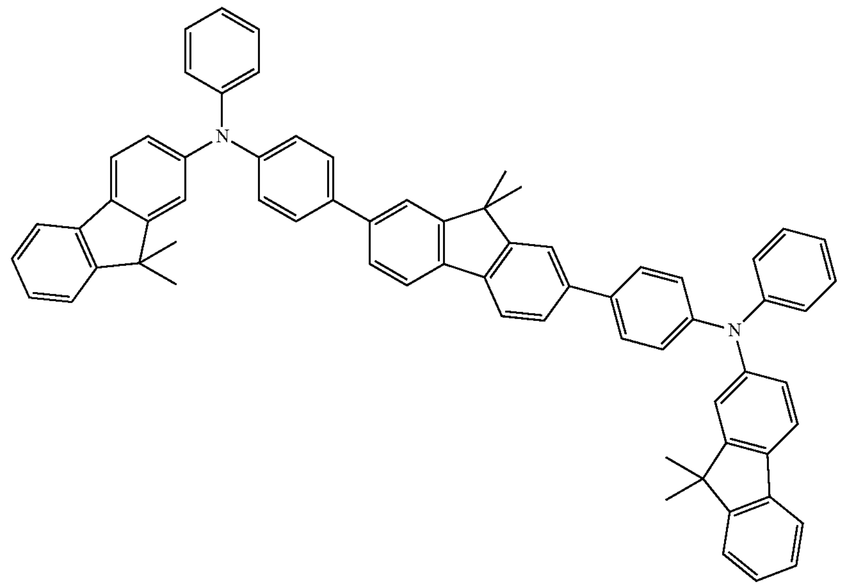
D1
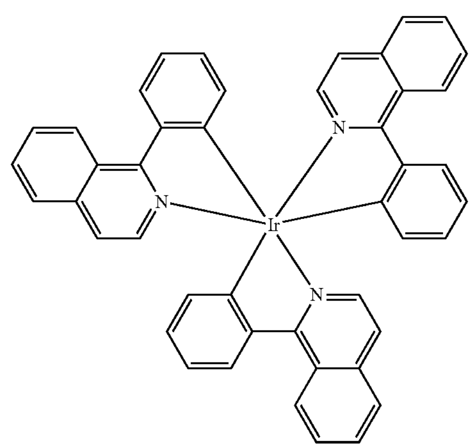
D3
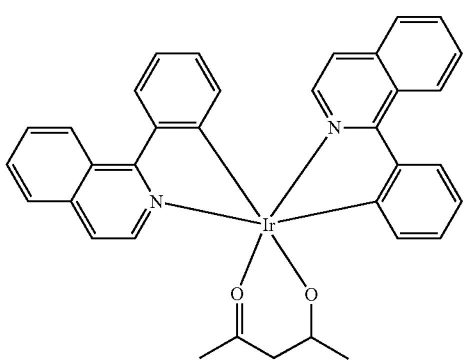
A7
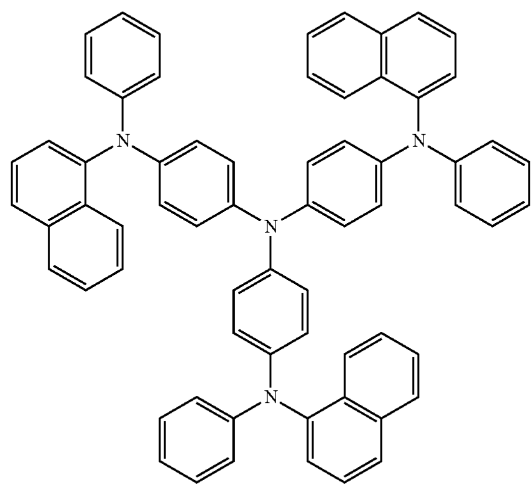
D2
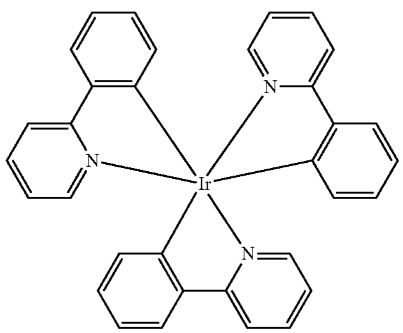

-continued

D4

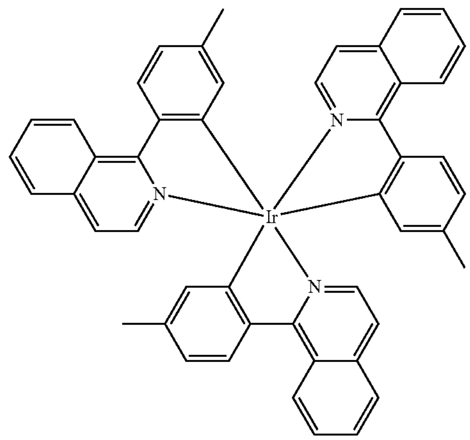

ET1

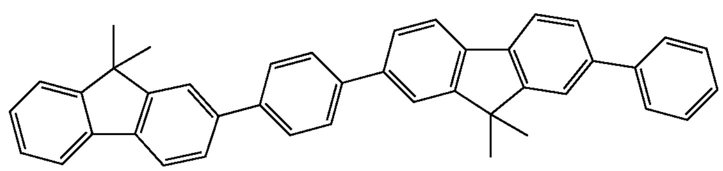

ET2

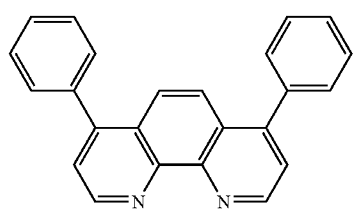

In addition, Table 1 below shows the HOMOs and LUMOs of part of the above-mentioned compounds. The following HOMO values were measured with an AC-2 manufactured by RIKEN KEIKI Co., Ltd. Used as a sample was a product obtained by depositing a compound from the vapor onto a glass substrate onto which Al had been deposited from the vapor so that the compound had a thickness of 400 Å. In addition, energy gaps were each determined from the absorption terminals of a UV-visible absorption spectrum obtained by measurement with a JASCO V-560 (UV-visible absorption spectrometer). Used as a sample for the UV-visible absorption spectrum was a product obtained by depositing a compound from the vapor onto a glass substrate so that the compound had a thickness of 400 Å. LUMO values were calculated by subtracting the energy gaps from the HOMO values.

TABLE 1

| | HOMO [eV] | LUMO [eV] |
|---|---|---|
| Compound H1 | 5.8 | 2.8 |
| Compound H2 | 5.7 | 2.7 |
| Compound H3 | 6.0 | 2.4 |
| Compound D1 | 5.2 | 2.7 |
| Compound D2 | 5.2 | 2.4 |
| Compound D3 | 5.3 | 2.8 |
| Compound D4 | 5.2 | 2.7 |

TABLE 1-continued

| | HOMO [eV] | LUMO [eV] |
|---|---|---|
| Compound A1 | 5.2 | 2.2 |
| Compound A2 | 5.1 | 2.1 |
| Compound A3 | 5.3 | 2.1 |
| Compound A4 | 5.3 | 2.3 |
| Compound A5 | 5.3 | 2.3 |
| Compound A6 | 5.6 | 2.3 |
| Compound A7 | 5.0 | 2.0 |

Example 1

An organic light-emitting device having the configuration illustrated in FIG. 1A was produced. First, an ITO was formed into a film on a glass substrate (the transparent substrate 10) by a sputtering method. Thus, the transparent electrode 11 (anode) was formed. In this case, the thickness of the transparent electrode 11 was set to 100 nm. Next, patterning was performed by a photolithography step so that the transparent electrode had an area of 3.14 $mm^2$. Next, organic compound layers and electrode layers shown in Table 2 below were continuously formed in the order on the substrate on which the ITO film had been formed by performing vacuum deposition based on resistance heating in a vacuum chamber at $1\times10^{-4}$ Pa.

TABLE 2

| Organic compound layers and electrode layers | | Constituents | Thickness [nm] |
|---|---|---|---|
| Hole transport layer 12 | | Compound A2 | 40 |
| Emission layer 13 | | H1 (host) D1 (first dopant) A3 (second dopant) (H1:D1:A3 = 80:4:16 (weight ratio) | 50 |
| Electron transport layer 14 | | ET2 | 25 |
| Metal electrode layers 15 | First metal electrode layer | KF | 1 |
| | Second metal electrode layer | A1 | 100 |

Thus, the organic light-emitting device was obtained.

A voltage was applied to the resultant device with a power source R6144 manufactured by Advantest Corporation, and values for a current and a voltage energized in the device were each measured with a 2700 Multimeter manufactured by Keithley Instruments, Inc. in a voltage/current step. In addition, an emission luminance at each voltage or current was measured with a luminance meter (BM-7 Fast manufactured by TOPCON CORPORATION). Further, an emission spectrum output from the light-emitting device was measured with a spectroradiometer (SR-3 manufactured by TOPCON CORPORATION).

As a result of the emission spectrum measurement, an emission spectrum mainly derived from Compound D1 as a light-emitting dopant was observed, and its chromaticity coordinates were (0.68, 0.32). Accordingly, it was shown that the luminescent color of an organic light-emitting device was red when Compound D1 was used as a light-emitting dopant.

Here, a red emission luminance needed for obtaining white light having a luminance of 500 cd/m$^2$ when a display is produced by using the organic light-emitting device is evaluated by the following method.

First, the following items (a) to (c) are taken into consideration.

(a) An emission loss due to a polarizing plate: 0.5 time (b) The aperture ratio of a pixel as a display panel: 0.5 time (c) An emission time by duty driving (emission time per one frame time): 33%

The needed luminance was determined from the following equation in consideration of those items.

$$500\times(3/10)\times2\times2\times3=1{,}800\ \text{cd/m}^2$$

Light-emitting property when the luminance was set to 1,800 cd/m$^2$ was evaluated based on the above-mentioned calculation result. Table 4 shows the result of the evaluation. It should be noted that a device that showed a current efficiency of 9 cd/A or more (20 mA/cm$^2$ or less in terms of current density) when the luminance was set to 1,800 cd/m$^2$ was evaluated as "GOOD" and a device that showed a current efficiency of less than 9 cd/A in the same setting was evaluated as "NG".

Comparative Example 1

An organic light-emitting device was produced in the same manner as in Example 1 except that Compound D2 was used instead of Compound A3 as the second dopant in Example 1.

An emission spectrum was measured in the same manner as in Example 1. As a result, an emission spectrum mainly derived from Compound D1 as a light-emitting dopant was observed. In addition, the device was evaluated for its light-emitting property in the same manner as in Example 1. Table 4 shows the result.

Example 2

An organic light-emitting device having the configuration illustrated in FIG. 1B was produced. First, an ITO was formed into a film on a glass substrate (the transparent substrate 10) by a sputtering method. Thus, the transparent electrode 11 (anode) was formed. In this case, the thickness of the transparent electrode 11 was set to 100 nm. Next, patterning was performed by a photolithography step so that the transparent electrode had an area of 3.14 mm$^2$. Next, organic compound layers and electrode layers shown in Table 3 below were continuously formed in the order on the substrate on which the ITO film had been formed by performing vacuum deposition based on resistance heating in a vacuum chamber at $1\times10^{-4}$ Pa.

TABLE 3

| Organic compound layers and electrode layers | | Constituents | Thickness [nm] |
|---|---|---|---|
| Hole transport layer 12 | | Compound A2 | 40 |
| Emission layer 13 | | H2 (host) D1 (first dopant) A2 (second dopant) (H2:D1:A2 = 80:4:16 (weight ratio)) | 50 |
| Hole/exciton-blocking layer 16 | | ET1 | 10 |
| Electron transport layer 14 | | ET2 | 15 |
| Metal electrode layers 15 | First metal electrode layer | KF | 1 |
| | Second metal electrode layer | A1 | 100 |

Thus, the organic light-emitting device was obtained.

An emission spectrum was measured in the same manner as in Example 1. As a result, an emission spectrum mainly derived from Compound D1 as a light-emitting dopant was observed. In addition, the device was evaluated for its light-emitting property in the same manner as in Example 1. Table 4 shows the result.

Example 3

An organic light-emitting device was produced in the same manner as in Example 1 except that Compound A1 was used instead of Compound A2 as the second dopant in Example 2.

An emission spectrum was measured in the same manner as in Example 1. As a result, an emission spectrum mainly derived from Compound D1 as a light-emitting dopant was observed. In addition, the device was evaluated for its light-emitting property in the same manner as in Example 1. Table 4 shows the result.

Comparative Example 2

An organic light-emitting device was produced in the same manner as in Example 1 except that Compound D2 was used instead of Compound A2 as the second dopant in Example 2.

An emission spectrum was measured in the same manner as in Example 1. As a result, an emission spectrum mainly derived from Compound D1 as a light-emitting dopant was observed. In addition, the device was evaluated for its light-emitting property in the same manner as in Example 1. Table 4 shows the result.

TABLE 4

| | Luminous efficiency [Cd/A@200 cd/m$^2$] | Luminous efficiency [Cd/A@1,800 cd/m$^2$] | Device evaluation |
|---|---|---|---|
| Example 1 | 9.6 | 9.0 | GOOD |
| Comparative Example 1 | 8.9 | 7.4 | NG |
| Example 2 | 10.1 | 9.5 | GOOD |
| Example 3 | 10.4 | 9.8 | GOOD |
| Comparative Example 2 | 8.4 | 7.4 | NG |

Example 4

An organic light-emitting device having the configuration illustrated in FIG. 1C was produced. First, an ITO was formed into a film on a glass substrate (the transparent substrate 10) by a sputtering method. Thus, the transparent electrode 11 (anode) was formed. In this case, the thickness of the transparent electrode 11 was set to 100 nm. Next, patterning was performed by a photolithography step so that the transparent electrode had an area of 3.14 mm$^2$. Next, organic compound layers and electrode layers shown in Table 5 below were continuously formed in the order on the substrate on which the ITO film had been formed by performing vacuum deposition based on resistance heating in a vacuum chamber at $1\times10^{-4}$ Pa.

TABLE 5

| Organic compound layers and electrode layers | | Constituents | Thickness [nm] |
|---|---|---|---|
| Hole transport layer 12 | | Compound A2 | 40 |
| Electron/exciton-blocking layer 17 | | Compound A4 | 10 |
| Emission layer 13 | | H3 (host) D2 (first dopant) A2 (second dopant) (H3:D2:A2 = 80:4:16 (weight ratio)) | 50 |
| Hole/exciton-blocking layer 16 | | ET1 | 10 |
| Electron transport layer 14 | | ET2 | 15 |
| Metal electrode layers 15 | First metal electrode layer | KF | 1 |
| | Second metal electrode layer | A1 | 100 |

Thus, the organic light-emitting device was obtained.

As a result of the emission spectrum measurement in the same manner as in Example 1, an emission spectrum mainly derived from Compound D2 as a light-emitting dopant was observed, and its chromaticity coordinates were (0.30, 0.65). Accordingly, it was shown that the luminescent color of an organic light-emitting device was green when Compound D2 was used as a light-emitting dopant.

Here, a green emission luminance needed for obtaining white light having a luminance of 500 cd/m$^2$ when a display was produced by using the organic light-emitting device was evaluated in the same manner as in Example 1, and the needed luminance was determined from the following equation.

$$500\times(6/10)\times2\times2\times3=3{,}600\ \text{cd/m}^2$$

Light-emitting property when the luminance was set to 3,600 cd/m$^2$ was evaluated based on the above-mentioned calculation result. Table 6 shows the result of the evaluation. It should be noted that a device that showed a current efficiency of 36 cd/A or more (10 mA/cm$^2$ or less in terms of current density) when the luminance was set to 3,600 cd/m$^2$ was evaluated as "GOOD" and a device that showed a current efficiency of less than 36 cd/A in the same setting was evaluated as "NG".

Comparative Example 3

An organic light-emitting device was produced in the same manner as in Example 4 except the following. In Example 4, the second dopant was not used, and an emission layer was formed by co-depositing Compounds H3 and D2 from the vapor so that a weight ratio between the compounds was 96:4.

An emission spectrum was measured in the same manner as in Example 1. As a result, an emission spectrum mainly derived from Compound D2 as a light-emitting dopant was observed. In addition, the device was evaluated for its light-emitting property in the same manner as in Example 1. Table 6 shows the result.

TABLE 6

| | Luminous efficiency [Cd/A@200 cd/m$^2$] | Luminous efficiency [Cd/A@3,600 cd/m$^2$] | Device evaluation |
|---|---|---|---|
| Example 3 | 58.1 | 54.7 | GOOD |
| Comparative Example 4 | 40.2 | 30.5 | NG |

Evaluation of Top Emission Device

Example 5

An organic light-emitting device having the configuration illustrated in FIG. 1D was produced. First, Compound A1 was formed into a film on a glass substrate (the transparent substrate 10) by a sputtering method. Thus, the reflective film 18 was formed. Next, an IZO was formed into a film on the reflective film 18 by a sputtering method. Thus, the transparent electrode 11 was formed. In this case, the thickness of the transparent electrode 11 was set to 100 nm. Next, patterning was performed by a photolithography step so that the transparent electrode had an area of 4.00 mm$^2$. Next, organic compound layers and electrode layers shown in Table below were continuously formed in the order on the substrate on which the IZO film had been formed by performing vacuum deposition based on resistance heating in a vacuum chamber at $1\times10^{-4}$ Pa.

TABLE 7

| Organic compound layers and electrode layers | Constituents | Thickness [nm] |
|---|---|---|
| Hole transport layer 12 | Compound A2 | 190 |
| Emission layer 13 | H1 (host) D3 (first dopant) A1 (second dopant) (H1:D3:A1 = 80:4:16 (weight ratio)) | 30 |
| Hole/exciton-blocking layer 16 | ET1 | 10 |
| Electron transport layer 14 | ET2 | 10 |
| Electron injection layer 19 | ET2, $Cs_2CO_3$ | 40 |
| Transparent electrode 11a | IZO | 30 |

Thus, the organic light-emitting device was obtained.

An emission spectrum was measured in the same manner as in Example 1. As a result, an emission spectrum mainly derived from Compound D3 as a light-emitting dopant was observed. In addition, the device was evaluated for its light-emitting property in the same manner as in Example 1. Table 8 shows the result.

Example 6

An organic light-emitting device was produced in the same manner as in Example 5 except that Compound A4 was used instead of Compound A1 as the second dopant in Example 5.

An emission spectrum was measured in the same manner as in Example 1. As a result, an emission spectrum mainly derived from Compound D3 as a light-emitting dopant was observed. In addition, the device was evaluated for its light-emitting property in the same manner as in Example 1. Table 8 shows the result.

Comparative Example 4

An organic light-emitting device was produced in the same manner as in Example 5 except that Compound A7 was used instead of Compound A1 as the second dopant in Example 5.

An emission spectrum was measured in the same manner as in Example 1. As a result, an emission spectrum mainly derived from Compound D3 as a light-emitting dopant was observed. In addition, the device was evaluated for its light-emitting property in the same manner as in Example 1. Table 8 shows the result.

Comparative Example 5

An organic light-emitting device was produced in the same manner as in Example 5 except that Compound A5 was used instead of Compound A1 as the second dopant in Example 5.

An emission spectrum was measured in the same manner as in Example 1. As a result, an emission spectrum mainly derived from Compound D3 as a light-emitting dopant was observed. In addition, the device was evaluated for its light-emitting property in the same manner as in Example 1. Table 8 shows the result.

Comparative Example 6

An organic light-emitting device was produced in the same manner as in Example 5 except the following. In Example 5, the second dopant was not used, and an emission layer was formed by co-depositing Compounds H3 and D2 from the vapor so that a weight ratio between the compounds was 96:4.

An emission spectrum was measured in the same manner as in Example 1. As a result, an emission spectrum mainly derived from Compound D3 as a light-emitting dopant was observed. In addition, the device was evaluated for its light-emitting property in the same manner as in Example 1. Table 8 shows the result.

TABLE 8

| | Luminous efficiency [Cd/A@200 cd/$m^2$] | Luminous efficiency [Cd/A@1,800 cd/$m^2$] | Device evaluation |
|---|---|---|---|
| Example 5 | 13.6 | 11.6 | GOOD |
| Example 6 | 14.4 | 11.3 | GOOD |
| Comparative Example 4 | 11.5 | 8.8 | NG |
| Comparative Example 5 | 9.5 | 5.7 | NG |
| Comparative Example 6 | 15.9 | 4.8 | NG |

[Evaluation for Film Property by DSC]

A film corresponding to an emission layer was evaluated for its property by performing differential scanning calorimetry (DSC). It should be noted that each material was subjected to thermogravimetry and differential thermal analysis (TG/DTA), and each compound was evaluated for its thermal decomposition temperature before the DSC was performed. In addition, an upper limit for a scanning temperature range in the DSC was appropriately adjusted to suit the lowest decomposition temperature.

Meanwhile, a sample used in the DSC was prepared as described below. After the powders of the compounds in the emission layer had been mixed at the same ratio as the weight mixing ratio in the emission layer, 3 to 4 mg of the mixture were loaded into an aluminum sample pan, and then the pan was sealed. Next, the sample was heated to a temperature equal to or more than its melting point once to be changed into a molten liquid. After that, the sample was rapidly cooled to liquid nitrogen temperature to be brought into an amorphous state. Next, a rate of temperature rise was set to 20° C./min and the temperature was increased to 380° C. equal to or less than the decomposition temperature. After the temperature had been held at the value (380° C.) for 5 minutes, a rate of temperature lowering was set to 40° C./min, and DSC was performed in a cooling process from 380° C. to −40° C. (lowering temperature measurement). Next, the temperature was held at −40° C. for 5 minutes. After that, a rate of temperature rise was set to 20° C./min, and DSC was performed in a rising temperature process from −40° C. to 380° C. (rising temperature measurement).

Figure 2A:
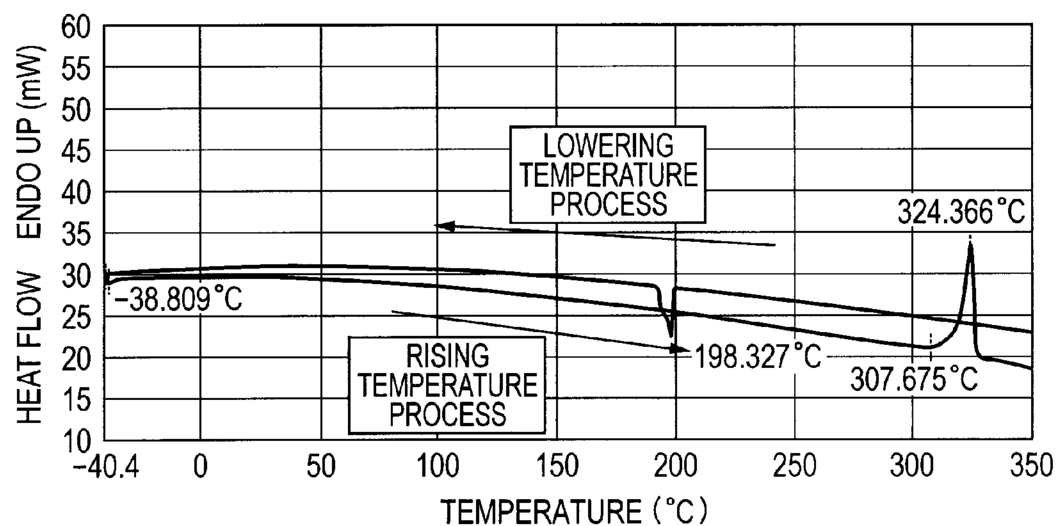
FIG. 2A is a view illustrating the results of DSC in a mixture of Compounds H1 and D1 (two-component solid).
Figure 2B:
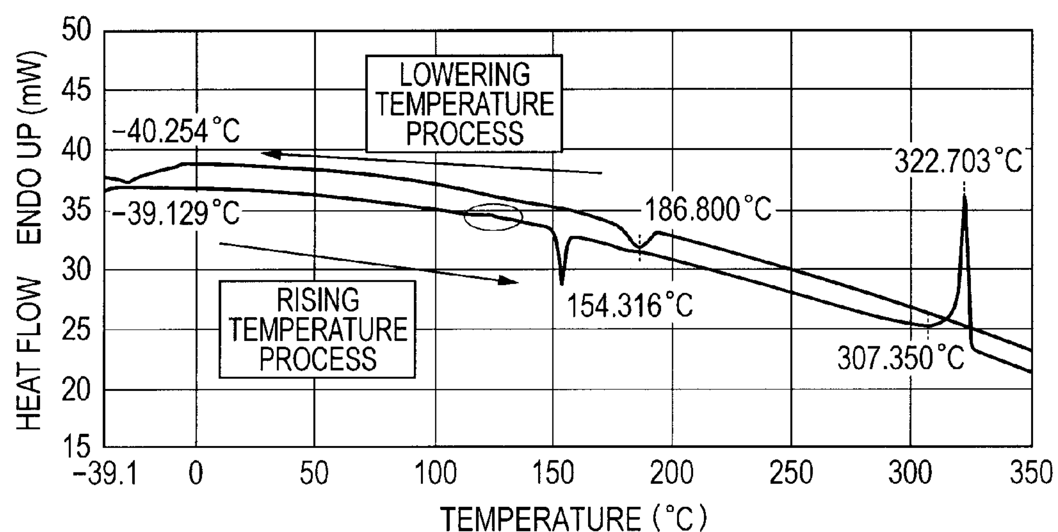
FIG. 2B is a view illustrating the results of DSC in a mixture of Compounds H1, D1, and A1 (three-component solid).

FIG. 2A is a view illustrating the results of DSC in a mixture of Compounds H1 (host) and D1 (first dopant) (H1:D1=96:4 (weight ratio), hereinafter referred to as “two-component solid”). Meanwhile, FIG. 2B is a view illustrating the results of DSC in a mixture of Compounds H1 (host), D1 (first dopant), and A1 (second dopant) (H1:D1:A1=80:4:16 (weight ratio), hereinafter referred to as “three-component solid”).

As can be seen from FIG. 2A, a sharp exothermic peak was observed in a cooling process from a molten liquid in the two-component solid. Meanwhile, as can be seen from FIG. 2B, a gentle, broad exothermic peak was observed in the three-component solid. It is assumed from the foregoing that a phase transition from a liquid to a solid (crystallization) occurs in the two-component solid while the phase transition (crystallization) does not occur in the three-component solid. In addition, the fact that the three-component solid shows a glass transition at 120° C. to 140° C. (circled portion) also suggests that the crystallization does not occur. Further, a peak showing the crystallization is observed in a rising temperature process after the cooling process as well after passage through the glass transition. Accordingly, it is shown that the solid is amorphous at room temperature. It is assumed from the foregoing that the three-component solid is superior in film property to the two-component solid.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-010011, filed Jan. 20, 2010, which is hereby incorporated by reference herein in its entirety.

What is claimed is:

1. An organic light-emitting device, comprising:

an anode;

a cathode; and an organic compound layer being interposed between the anode and the cathode, and including an emission layer, wherein:

the emission layer has a host, a first dopant, and a second dopant;

the host comprises an aromatic hydrocarbon compound;

the first dopant comprises a phosphorescent iridium complex; and the second dopant comprises a compound having two triarylamine structures.

2. The organic light-emitting device according to claim 1, wherein the first dopant is represented by any one of the following general formulae (1) to (6):

(1)

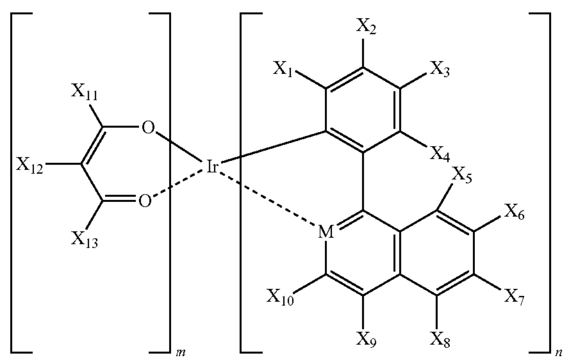

-continued (2)

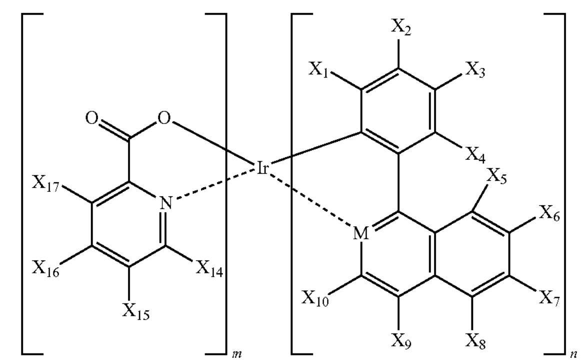

(3)

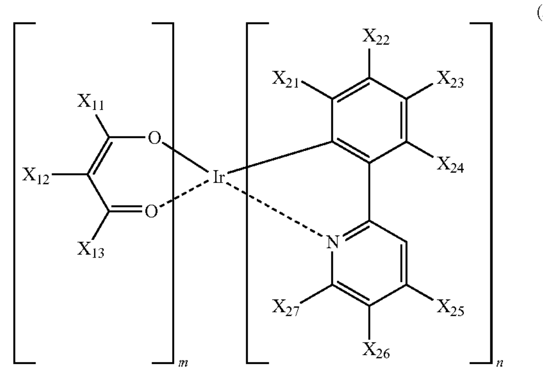

(4)

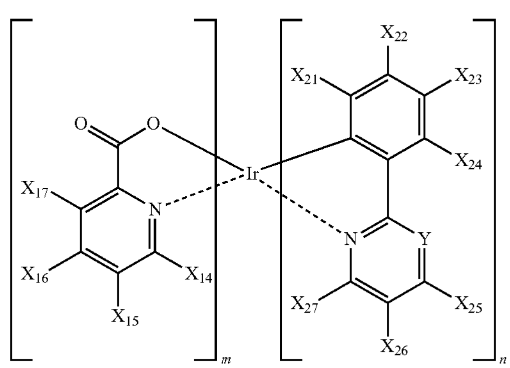

(5)

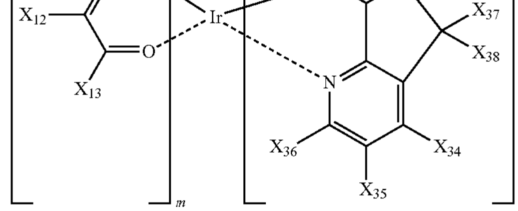

-continued (6)

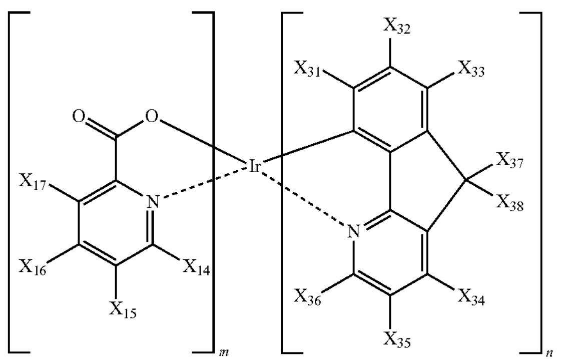

in the formulae (1) and (2), $X_1$ to $X_{10}$ each represent one of a hydrogen atom, an unsubstituted or fluorine atom-substituted alkyl group, an aryl group, an alkoxy group, and a halogen atom, and m represents an integer of 0 to 2 and n represents an integer of 1 to 3, provided that m+n=3; in the formula (1), $X_{11}$ to $X_{13}$ each represent one of a hydrogen atom, an unsubstituted or fluorine atom-substituted alkyl group, an aryl group, an alkoxy group, and a halogen atom;

in the formula (2), $X_{14}$ to $X_{17}$ each represent one of a hydrogen atom, an unsubstituted or fluorine atom-substituted alkyl group, an aryl group, an alkoxy group, and a halogen atom;

in the formulae (3) and (4), $X_{21}$ to $X_{27}$ each represent one of a hydrogen atom, an unsubstituted or fluorine atom-substituted alkyl group, an aryl group, an alkoxy group, and a halogen atom, Y represents one of N and CR(R represents the same substituent as that represented by each of $X_{21}$ to $X_{27}$), and m represents an integer of 0 to 2 and n represents an integer of 1 to 3, provided that m+n=3; in the formula (3), $X_{11}$ to $X_{13}$ each represent one of a hydrogen atom, an unsubstituted or fluorine atom-substituted alkyl group, an aryl group, an alkoxy group, and a halogen atom;

in the formula (4), $X_{14}$ to $X_{17}$ each represent one of a hydrogen atom, an unsubstituted or fluorine atom-substituted alkyl group, an aryl group, an alkoxy group, and a halogen atom;

in the formulae (5) and (6), $X_{31}$ to $X_{38}$ each represent one of a hydrogen atom, an unsubstituted or fluorine atom-substituted alkyl group, an aryl group, an alkoxy group, and a halogen atom, and m represents an integer of 0 to 2 and n represents an integer of 1 to 3, provided that m+n=3;

in the formula (5), $X_{11}$ to $X_{13}$ each represent one of a hydrogen atom, an unsubstituted or fluorine atom-substituted alkyl group, an aryl group, an alkoxy group, and a halogen atom; and in the formula (6), $X_{14}$ to $X_{17}$ each represent one of a hydrogen atom, an unsubstituted or fluorine atom-substituted alkyl group, an aryl group, an alkoxy group, and a halogen atom.

3. The organic light-emitting device according to claim 1, wherein the second dopant is represented by the following general formula (7):

(7)

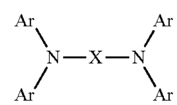

in the formula (7), X represents a substituted or unsubstituted arylene group and Ar represents a substituted or unsubstituted aryl group.

* * * * *